(12) United States Patent
Neuendorffer

(10) Patent No.: US 8,116,334 B1
(45) Date of Patent: Feb. 14, 2012

(54) DATAFLOW FIFO COMMUNICATION BUFFER USING HIGHLY-MULTIPORTED MEMORIES

(75) Inventor: Stephen A. Neuendorffer, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/962,438

(22) Filed: Dec. 7, 2010

Related U.S. Application Data

(62) Division of application No. 11/880,160, filed on Jul. 19, 2007, now Pat. No. 7,869,452.

(51) Int. Cl.
*H04L 12/28* (2006.01)
*H04L 12/56* (2006.01)
*H04L 1/00* (2006.01)
*H04L 12/26* (2006.01)

(52) U.S. Cl. ...... 370/414; 370/416; 370/418; 370/235.1

(58) Field of Classification Search .......... 370/412–418, 370/235.1
See application file for complete search history.

(56) References Cited

U.S. PATENT DOCUMENTS

| | | | |
|---|---|---|---|
| 5,179,680 A | 1/1993 | Colwell et al. | |
| 5,664,116 A | 9/1997 | Gaytan et al. | |
| 6,067,298 A | 5/2000 | Shinohara | |
| 6,275,920 B1 | 8/2001 | Abercrombie et al. | |
| 7,038,952 B1 | 5/2006 | Zack et al. | |
| 7,260,688 B1 | 8/2007 | Baxter et al. | |
| 7,489,259 B2 | 2/2009 | Savell | |
| 7,594,047 B2 | 9/2009 | Luk | |
| 7,684,278 B1 | 3/2010 | Schumacher et al. | |
| 2003/0189947 A1 | 10/2003 | Beshai | |
| 2005/0021628 A1 | 1/2005 | Johansson | |
| 2008/0031129 A1 | 2/2008 | Arseneault et al. | |
| 2008/0205278 A1 | 8/2008 | Garmire et al. | |

OTHER PUBLICATIONS

U.S. Appl. No. 11/880,160, filed Jul. 19, 2007, Neuendorffer.

*Primary Examiner* — Ronald Abelson
(74) *Attorney, Agent, or Firm* — Thomas A. Ward; Thomas George

(57) ABSTRACT

A First In First Out (FIFO) communication buffer for receiving data from a source and distributing the data to a first sink and a second sink is disclosed. The FIFO communication buffer includes a FIFO memory and a FIFO control circuit. The FIFO memory includes a first data port, a second data port, and a third data port. The FIFO control circuit provides the first address, the second address and the third address. The FIFO control circuit increments the first address toward the second address and the third address when valid data is received, and increments the second address and the third address when data is read out.

12 Claims, 4 Drawing Sheets

DATAFLOW FIFO COMMUNICATION BUFFER USING HIGHLY-MULTIPORTED MEMORIES

CROSS-REFERENCE TO RELATED APPLICATIONS

This application is a divisional of U.S. patent application having the application Ser. No. 11/880,160 filed on Jul. 19, 2007 and titled "DATAFLOW FIFO COMMUNICATION BUFFER USING HIGHLY-MULTIPORTED MEMORIES" by Stephen Neuendorffer.

FIELD OF THE INVENTION

Embodiments of the present invention relate to features of a Field Programmable Gate Array (FPGA) programmed to form a system including a First In First Out (FIFO) communication buffer. More particularly, the present invention relates to efficient implementation of FIFO communication buffers to distribute data from a single source to multiple data sink devices.

BACKGROUND OF THE INVENTION

Conventional processor based systems use some form of memory controller in order to access memory devices and provide arbitration for devices connected to the memory controller ports, such as processors or other peripherals. To address the need to configure a memory controller to provide maximum bandwidth when used with various processor systems, a programmable logic device such as a Field Programmable Gate Array (FPGA) has been used to create the memory controller. FPGAs can be used to provide a wide variety of these memory controllers, including single port and multiport memory controllers.

Traditional PLDs such as Field Programmable Gate Arrays (FPGAs) and Complex PLDs (CPLDs) are programmable to form modules that are networked together to communicate. The modules may be complex core devices such as soft processors constructed using FPGA logic, or other less complex components. With the modules potentially operating at different speeds, operating within different clock domains, or otherwise requiring data to be buffered between the modules for communication, a First in First out (FIFO) communication buffer is typically used to interconnect the cores. The FIFOs are often implemented with internal memory, or a combination of registers or other components of the FPGA.

FIG. 1 illustrates the interconnection of modules 2 and 4 using a FIFO 6. The FIFO 6 shown is unidirectional, with a data input (DATAIN) connected to a source module 2 and a data output (DATAOUT) connected to a sink module 4. The signal VALIDIN is asserted when input data from the source 2 is ready for transmission. Similarly, VALIDOUT is asserted from the FIFO 6 when data is stored in the FIFO for transmission. The signal STALLIN is asserted from the FIFO 6 when the FIFO becomes full and cannot accept additional data. Similarly, STALLOUT is asserted from the sink 4 when it is unable to accept data from the FIFO.

FIG. 2 illustrates more details of the FIFO 6 comprising FIFO memory 8 and its FIFO control logic 10. The FIFO memory 8 includes a data input (DA) for receiving the data input signal (DATAIN) and a data output (DB) for receiving the data output signal (DATAOUT). The input data is stored in the FIFO memory 8 at an address (ADDRA) provided from the FIFO control logic 10. Similarly, data read from the FIFO memory 8 is provided using an address (ADDRB) provided from the FIFO control logic 10. The FIFO memory 8 is clocked by a common clock signal CLK received at clock inputs (CLKA & CLKB). The B side output is enabled by a high applied to the enable input (ENB). With the FIFO memory 8 being unidirectional, writing at the output port is disabled by a low applied to the A side write enable input (WEB), while writing at the input port is enabled by a high applied to the B side write enable input (WEA).

The FIFO control logic 10 operates to address data for pushing and popping, and to send valid and stall signals. The FIFO control logic 10 generates the address signals (ADDRA) and (ADDRB) to control pushing or writing of data into memory locations of the FIFO memory 8, as well as to control popping or reading of data. The FIFO control logic 10 ensures that the output valid signal (VALIDOUT) is asserted if there is data in the FIFO memory 8. It further asserts a stall signal (STALLIN) if the FIFO memory 8 becomes full. If a stall signal is received from a sink module, the FIFO control logic 10 does not address a signal for reading at the output address (ADDRB). Similarly, if a valid signal (VALIDIN) is received from a source indicating data is being transmitted, a proper input address (ADDRA) is asserted.

For reference, a block diagram of components of a conventional FPGA that may be used to form source and sink modules and FIFOs that interconnect these modules is provided in FIG. 3. The FPGA includes input/output (IOBs) blocks 32 (each labeled 10) located around the perimeter of the FPGA, multi-gigabit transceivers (MGT) 34 interspersed with the I/O blocks 32, configurable logic blocks 36 (each labeled CLB) arranged in an array, block random access memory 38 (each labeled BRAM) interspersed with the CLBs, configuration logic 33, a configuration interface 31, an on-chip processor 16, and an internal configuration access port (ICAP) 35. The FPGA also includes a programmable interconnect structure (not shown) made up of traces that are programmably connectable between the CLBs 36 and IOBs 32 and BRAMs 38.

The configuration memory array 37 typically includes millions of the SRAM memory cells lying beneath the structure shown in FIG. 3. The configuration memory cells are programmed to configure the CLBs 36, IOBs 32, BRAMs 38 and appropriately connect the interconnect lines. Source and sink modules can be formed from these elements, as well as FIFOs. The BRAM memory 38, in particular, can be used to form a FIFO memory such as device 8 in FIG. 2, while simpler FIFO memories can be formed from registers or logic in the CLBs. The configuration memory array 37 programmed for the configuration can be visualized as a rectangular array of bits. The bits are grouped into frames that are one-bit wide words that extend in columns from the top of the array to the bottom. The configuration data values are typically loaded into the configuration memory array one frame at a time from the external store via the configuration interface 31.

In general, the FPGA of FIG. 3 is configured in response to a set of configuration data values that are loaded into a configuration memory array of the FPGA from an external store via configuration interface 31. The configuration logic 33 provides circuitry for programming of the configuration memory array cells 31 typically at startup. The FPGA can be reconfigured by rewriting data in the configuration memory array 31. In one reconfiguration method, the ICAP 35 is used to rewrite data in the configuration memory array in order to generate or instantiate the FPGAs internal logic (e.g., CLBs 36 and BRAMs 38). Without using the ICAP 35, reconfiguration can also be performed by loading reconfiguration frames through the configuration interface 31 using external customized logic components to over-write frame data in the configuration memory array.

It would be desirable to use the structure of an FPGA to provide an improved FIFO communication buffer for interconnecting modules. In particular, it would be desirable to provide a FIFO communication buffer and operation method that provides low-latency high-throughput data transfer to multiple sink modules while minimizing the amount of memory required for the FIFO memory.

SUMMARY

According to embodiments of the present invention, a design is provided for a communication system in an FPGA using a FIFO communication buffer to transmit data from a single source to multiple sinks.

Embodiments of the communication system include FIFO connection logic for interconnecting the FIFO communication buffer and the multiple sinks. The FIFO connection logic meets the requirement that the multiple sinks read from the single FIFO output simultaneously to assure both receive the data before it is erased from the FIFO.

In another embodiment, FIFO connection logic is provided between the output of a source and the inputs of two FIFOs to enable a single source module to supply two separate sinks. This configuration uses additional FIFOs, and may incur additional communication latency but does not require the sinks to simultaneously read from the FIFOs.

In another embodiment, a FIFO communication buffer is provided with multiple addressable output ports and associated control logic. This embodiment allows a single sink module to drive multiple sinks using the multi-output port FIFO communication buffer without requiring simultaneous reads. The dual output ported FIFO communication buffer further allows one data transfer per cycle, similar to the single output ported FIFO communication buffer that uses a simultaneous data read from multiple sink modules.

BRIEF DESCRIPTION OF THE DRAWINGS

Further details of the present invention are explained with the help of the attached drawings in which.

DETAILED DESCRIPTION

Figure 1:
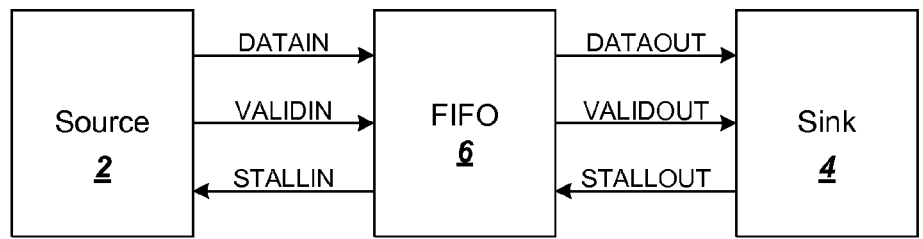
FIG. 1 is a block diagram depicting a prior art communication connection between a source module and a sink module using a FIFO communication buffer.
Figure 2:
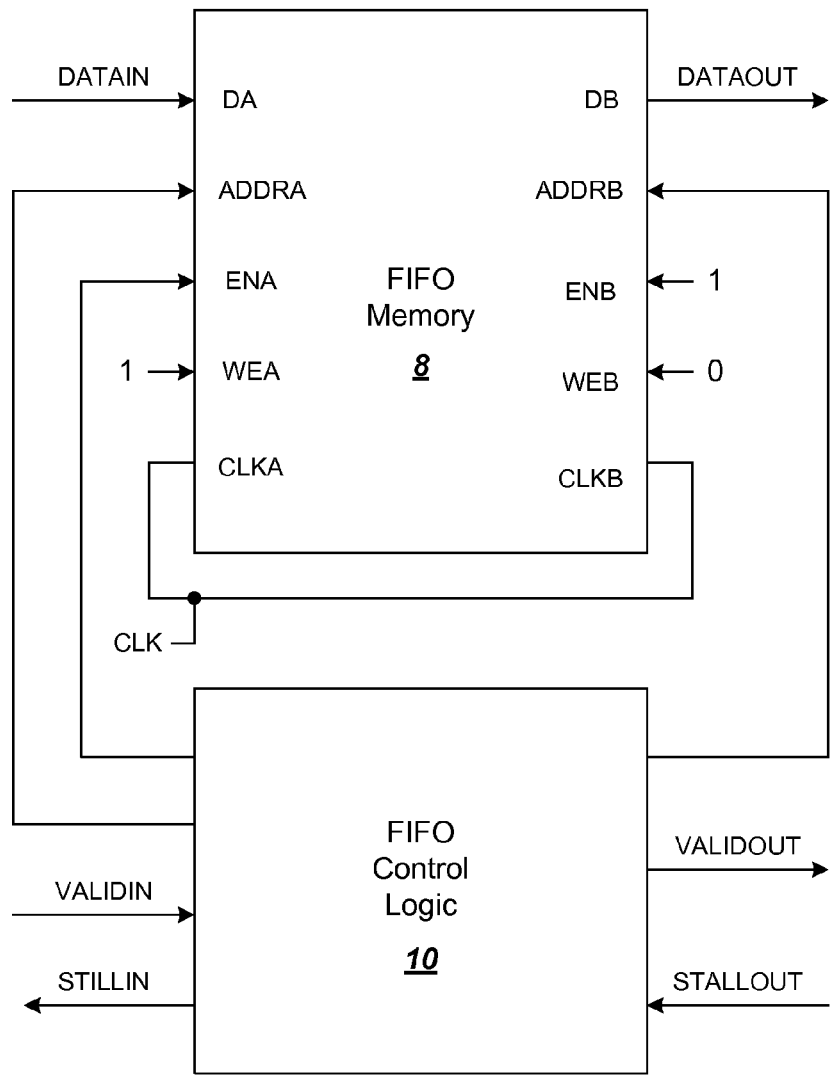
FIG. 2 illustrates further details of the FIFO memory and the associated FIFO control logic for the system of FIG. 1.
Figure 3:
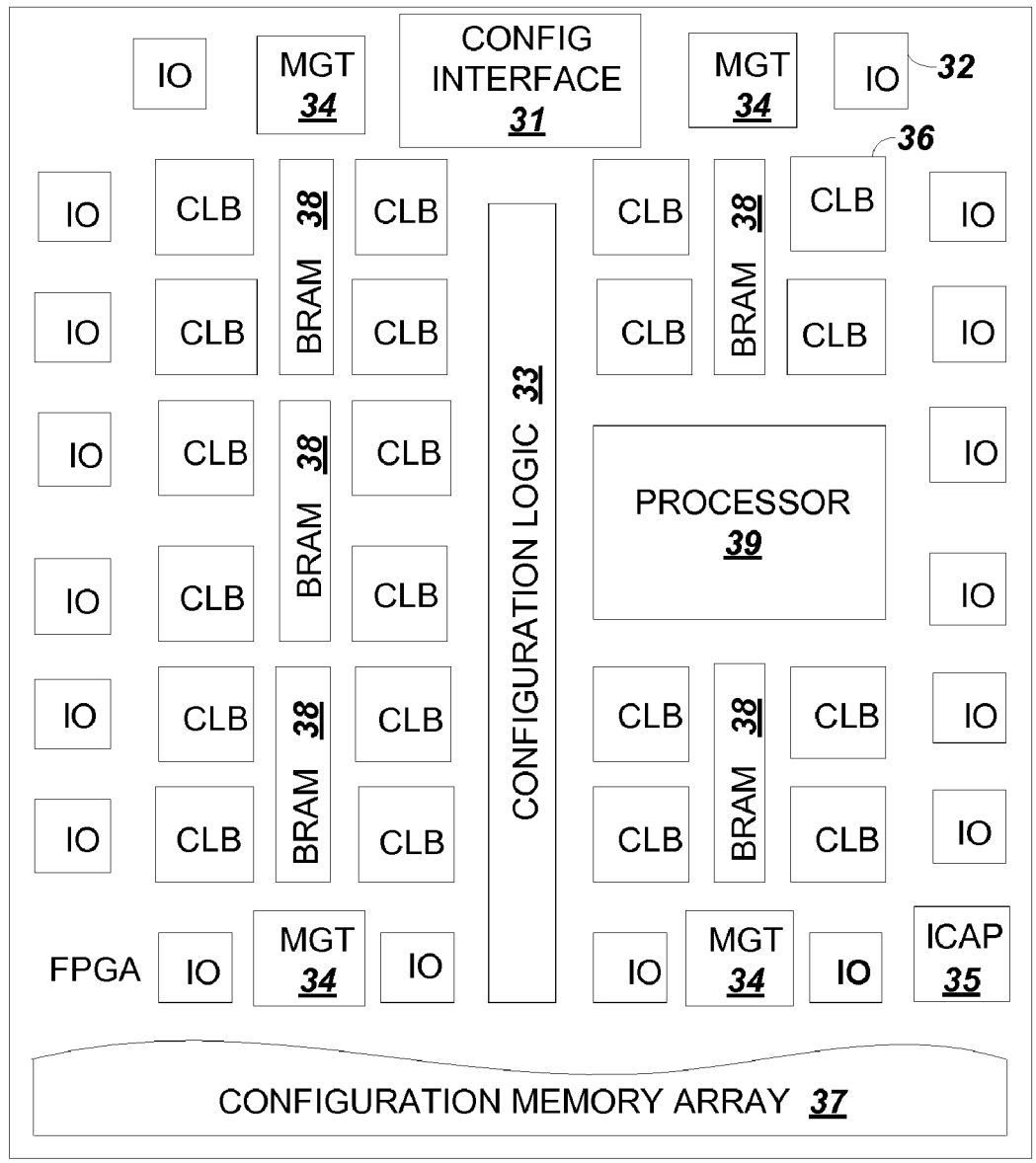
FIG. 3 is a block diagram depicting conventional components of an FPGA that can be used to create a memory communication system using a FIFO.
Figure 4:
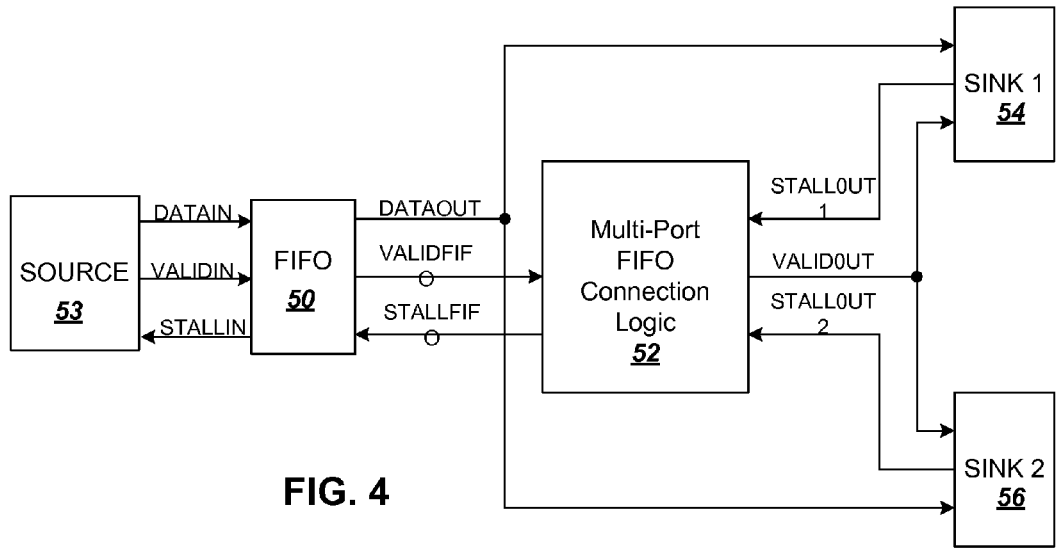
FIG. 4 is a block diagram illustrating additional control logic to provide a communication link from a single source module through a single FIFO to two separate sink modules in accordance with an embodiment of the present invention.

FIG. 4 shows an embodiment of the present invention with FIFO connection logic 52 and FIFO 50 providing signals from a source 53 to two separate sink modules 54 and 56. The source 53 provides data to FIFO 50 to distribute to sinks 54 and 56 over the DATAIN line and asserts VALIDIN when the data is ready for sending. The FIFO 50 provides a STALLIN signal in response if it is full, but otherwise accepts the data for distribution. Once data is in the FIFO 50 from the source 53, the FIFO connection logic 52 monitors the VALIDFIFO signal from FIFO 50 and separate stall signals: STALLOUT1 from sink 54 and STALLOUT2 from sink 56. Data is then provided from the FIFO 50 directly to sinks 54 and 56 based on control signals received from FIFO connection logic 52.

If the FIFO 50 has data to send, it will assert the VALIDFIFO. STALLFIFO will be asserted from connection logic 52 if either the STALLOUT1 indicates SINK1 is busy or STALLOUT2 indicates sink 56 is busy. When data is available in FIFO 50 as indicated by the signal VALIDFIFO, VALIDOUT is asserted by FIFO connection logic 52. Since data is provided from a single port of FIFO 50, it must remain available until received by both sinks 54 and 56.

Figure 5:
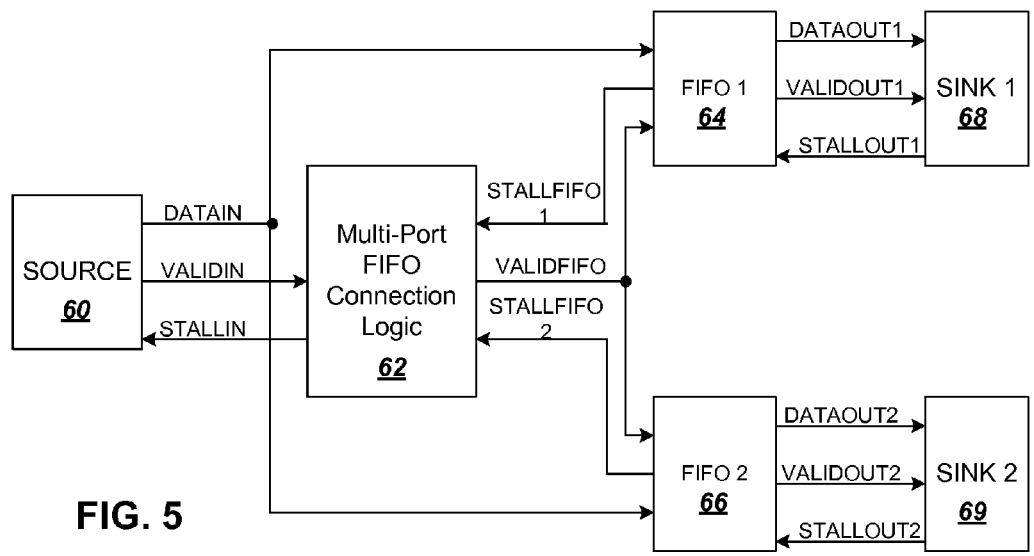
FIG. 5 shows an alternative communication data link from a single source module to two separate sink modules utilizing additional FIFO connection logic and two separate FIFO memories, in accordance with an embodiment of the present invention.

FIG. 5 illustrates another communication data link from a single source module to two separate sink modules utilizing additional FIFO connection logic and two separate FIFO memories in accordance with an embodiment of the present invention. In this embodiment, data transfer is allowed from a single source 60 to two sinks 68 and 69 that may enable sinks 68 and 69 to read different data at the same time. In FIG. 5, two separate FIFOs 64 and 66 are used, one for each of two sinks 68 and 69. Although this configuration avoids the need for a concurrent read of data from the source 60 by sinks 68 and 69, it can use significantly more storage for the FIFO memories included in FIFOs 64 and 66.

The FIFO connection logic 62 operates in FIG. 5 to connect communications between the source 60 and FIFOs 64 and 66. The FIFO connection logic 62 monitors the VALIDIN signals from source 60 and separate stall signals, STALLFIFO1 from FIFO 64 and STALLFIFO2 from FIFO memory 66. Data is provided from the source 60 directly to FIFOs 64 and 66 based on control signals received from the FIFO connection logic 62. If the source 60 has data to send, it will assert the VALIDIN. STALLIN will be asserted from FIFO connection logic 62 if either the STALLFIFO1 indicates FIFO 64 is full or STALLFIFO2 indicates FIFO 66 is full. When data is ready from source 60 as indicated by the signal VALIDIN, VALIDFIFO is asserted by FIFO connection logic 62.

Once data is distributed to both FIFO memories 64 and 66, communication occurs directly between the FIFOs 64 and 66 and individual sinks 68 and 69. In particular, FIFO 64 sends data signals DATAOUT1 as governed by signals VALIDOUT1 and STALLOUT1. FIFO 66 sends data signals DATAOUT2 as governed by signals VALIDOUT2 and STALLOUT2.

Figure 6:
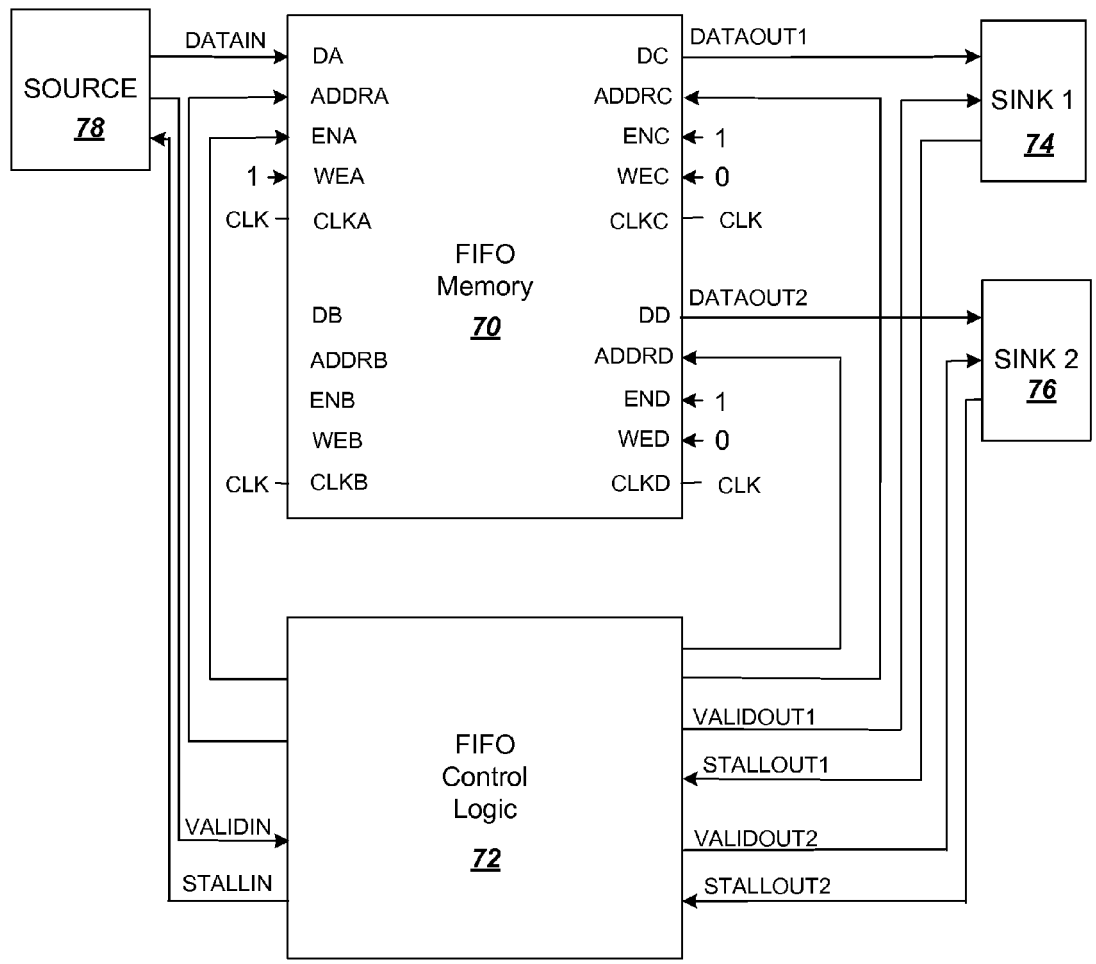
FIG. 6 shows details of a FIFO memory and its associated FIFO control logic, with the FIFO memory having two outputs allowing for creation of a system similar to FIG. 4, but without requiring the sinks to read data simultaneously from the FIFO, in accordance with an embodiment of the present invention.

FIG. 6 shows details of a FIFO memory 70 and its associated FIFO control logic 72, with the FIFO memory 70 having two outputs allowing for creation of a system similar to FIGS. 4 and 5, but that may enable the sinks to read different data at the same time using a single FIFO memory. As shown, the FIFO memory 70 includes an input port receiving signals labeled DA from a source 78, and two output ports providing signals labeled DC to sink 74 and signals labeled DD to sink 76. All of the ports of FIFO memory 70 are clocked with a common clock CLK. The DC and DD output ports are enabled with a high signal provided at respective enable ports ENC and END, while writing is disabled with a low signal at write enable ports WEC and WED. The input port DA is write enabled with a high provided at the write enable port WEA. An additional access port to the memory, made up of DB, ADDRB, ENB, and WEB is left unused.

The FIFO control logic 72 of FIG. 6 receives and provides stall and valid signals, and uses these signals to generate address signals for the FIFO memory 70. With a VALIDIN signal received from source 78, the FIFO control logic 72 realizes data is read at data input port DA, and provides an address ADDRA to FIFO memory 70 for storage of the data. The FIFO control logic 72 is implemented so that as data is written into the FIFO memory 70, ADDRA is incremented to approach ADDRC and ADDRD. The addresses ADDRC and ADDRC are incremented as data is read out of the FIFO memory 70. Only after data is read from output ports DC and DD to both sinks is the data element no longer stored in the FIFO memory 70, enabling the corresponding location in the FIFO memory 70 to be overwritten with new data. For a later read of the data out of FIFO memory 70, address signals ADDRC and ADDRD are provided to the output ports from the FIFO control logic 72 to enable read out in a first-in-first-out manner.

The FIFO control logic 72 generates STALLIN, VALIDOUT1, VALIDOUT2 and ENA according to the relative locations of ADDRA, ADDRC and ADDRD. The address ADDRC and ADDRD are maintained independently. The VALIDOUT1 signal from FIFO control logic 72 provided to sink 74 is derived from ADDRC indicating data is available from DC, while VALIDOUT2 provided to sink 76 is derived from ADDRD to indicate data is available from DD. The signal STALLIN is generated by the FIFO control logic 72 and sent to source 78 when the FIFO memory 70 is full.

Using the FIFO memory 70 and associated FIFO control logic 72 of FIG. 6, one data transfer per clock cycle can be made for the source 78 and each sink 74 and 76, similar to FIG. 4.

Although shown with only two sinks 74 and 76 in FIG. 6, as well as in FIGS. 4 and 5, alternative embodiments of the present invention provide for data to be transferred from a single source to multiple sinks. In FIG. 6, the multiple sinks will require additional valid and stall signals from the FIFO control logic 72, and multiple output ports for the FIFO memory 70. Similarly, additional components will be required to convey signals from a single source to more than two sinks in FIGS. 4 and 5.

Although shown with only a single clock signal CLK in FIG. 6, alternative embodiments of the present invention may provide for a single source and multiple sinks with independent clock signals which may be phase-aligned or not phase-aligned. In particular, the use of independent, not phase-aligned clock signals may require more control logic and possibly additional signals, depending on the asynchronous design style.

Although embodiments of the present invention have been described above with particularity, this was merely to teach one of ordinary skill in the art how to make and use the invention. Many additional modifications will fall within the scope of the invention, as that scope is defined by the following claims.

What is claimed is:

1. A First In First Out (FIFO) communication buffer for receiving data from a source and distributing the data to a first sink and a second sink, the FIFO communication buffer comprising:
   a FIFO memory having:
   a first data port for receiving the data from the source, and a first address port for addressing storage of the data written into the first address port;
   a second data port for providing the data to the first sink, and a second address port for addressing the data for reading from the second data port received at the first address port; and
   a third data port for providing the data to the second sink, and a third address port for addressing the data for reading from the third data port received at the first address port; and
   a FIFO control circuit for providing the first address, the second address and the third address, wherein the FIFO control circuit increments the first address toward the second address and the third address when valid data is received, and increments the second address and the third address when the data is read out.

2. The FIFO communication buffer of claim 1, wherein the FIFO control circuit further has a terminal receiving a first stall signal from the first sink and a second stall signal from the second sink to indicate when either the first data sink or the second data sink are busy, the FIFO control circuit then providing a responsive stall signal output signal at a terminal for the source when either the first data sink or the second data sink provide the stall signal.

3. The FIFO communication buffer of claim 1, wherein the FIFO control circuit further has a terminal receiving a valid-in signal from the source, the FIFO control circuit providing a responsive data valid signal at a first terminal to the first sink when the second address is incremented to enable reading of the valid data by the first sink, and at a second terminal when the third address is incremented to enable reading of the valid data by the second sink.

4. The FIFO communication buffer of claim 1, wherein the data is removed from the FIFO memory only after being read from the second first data port and at the third data port.

5. The FIFO communication buffer of claim 1, wherein the FIFO control circuit enables the data to be read into the first data port and read out from the second data port and the third data port during a single clock cycle.

6. The FIFO communication buffer of claim 1, wherein the system comprises a Field Programmable Gate Array (FPGA).

7. The FIFO communication buffer of claim 1, further for distributing the data to at least one additional data sink, the FIFO communication buffer further comprising:
   wherein the FIFO memory further comprises:
   at least one additional data port for providing the data to the at least one additional data sink, and at least one additional address port for addressing the data for reading from the at least one additional data port received at the first address port, and
   wherein the FIFO control circuit further provides the at least one additional address which is incremented when the data is read out of the at least on additional data port.

8. The FIFO communication buffer of claim 1, wherein the FIFO memory further comprises:
   a first clock port for receiving a first clock signal to clock data into the first data port;
   a second clock port for receiving a second clock signal to clock the data out of the second data port; and
   a third clock port for receiving a third clock signal to clock the data out of the third data port,
   wherein the first clock signal, the second clock signal and the third clock signal are different independent signals.

9. The FIFO communication buffer of claim 8, wherein the independent clock signals are phase aligned.

10. The FIFO communication buffer of claim 1, wherein the FIFO communication buffer is provided in a Field Programmable Gate Array (FPGA).

11. A method of distributing data received from a first device to a second device and a third device comprising:
 receiving the data at a FIFO memory;
 storing the data in the FIFO memory at an address ADDRA;
 retrieving the data from an address ADDRC within the FIFO memory;
 providing the retrieved data to the second device;
 retrieving the data from an address ADDRD within the FIFO memory;
 providing the retrieved data to the third device;
 incrementing the address ADDRA toward the address ADDRC and the address ADDRD when the received data is valid; and
 incrementing the address ADDRC and the address ADDRD when data is read out.

12. A communication buffer for receiving data from a first device and distributing the data to a second device and a third device, the communication buffer comprising:
 a FIFO memory having:
  a first data port for receiving the data from the first device;
  a first address port for receiving an address ADDRA at which the data is stored within the FIFO memory;
  a second data port for reading the data and providing the data to the second device;
  a second address port for receiving an address ADDRC for addressing the data which is read from the second data port;
  a third data port for reading the data and providing the data to the third device;
  a third address port for receiving an address ADDRD for addressing the data which is read from the third data port; and
 a FIFO control circuit for providing the address ADDRA, the address ADDRC and the address ADDRD, wherein the FIFO control circuit increments the address ADDRA toward the address ADDRC and the address ADDRD when valid data is received, and increments the address ADDRC and the address ADDRD when the data is read out.

\* \* \* \* \*